United States Patent [19]

Kubosawa et al.

[11] Patent Number: 4,837,461
[45] Date of Patent: Jun. 6, 1989

[54] MASTER SLICE TYPE INTEGRATED CIRCUIT

[75] Inventors: Hajime Kubosawa; Masato Ishiguro, both of Machida, Japan

[73] Assignee: Fujitsu Limited, Kawasaki, Japan

[21] Appl. No.: 155,571

[22] Filed: Feb. 12, 1988

[30] Foreign Application Priority Data

Feb. 24, 1987 [JP] Japan .................. 62-40603

[51] Int. Cl.[4] ................ H03K 3/26; H03K 19/173
[52] U.S. Cl. ................ 307/303; 307/469; 307/451; 307/465
[58] Field of Search ............... 307/303, 303.1, 303.2, 307/270, 482.1, 465.1, 304, 451, 469

[56] References Cited

U.S. PATENT DOCUMENTS 4,760,289 7/1988 Eichelberger et al. .......... 307/303

FOREIGN PATENT DOCUMENTS 0093003 4/1983 European Pat. Off. .
58-209142 3/1984 Japan .

OTHER PUBLICATIONS

"N Channel Master Slice", by Kelly et al., IBM Technical Disclosure Bulletin, vol. 20, No. 11A, Apr. 1978.
"Layout of an Inter-Board Driver Circuit", by Vicary, IBM Technical Disclosure Bulletin, vol. 21, No. 4, Sep. 1978.

Primary Examiner—Stanley D. Miller
Assistant Examiner—Richard Roseen
Attorney, Agent, or Firm—Staas & Halsey

[57] ABSTRACT

A master slice type integrated circuit in which various circuits may be formed by varying the routing of interconnections, comprises a plurality of input/output cells being arranged in a peripheral region on a semiconductor chip; a plurality of basic cell columns each comprising a plurality of basic cells arranged in a predetermined direction, each basic cell constituting transistors; an interconnection region formed on the chip, for accommodating a data bus; and a plurality of latch cells being arranged in the basic cell columns, for keeping a potential of a data bus laid on the interconnection region to prevent the data bus from being changed into a floating state, each latch cell comprising transistors, each of which has a driving capability smaller than that of each transistor of the basic cell.

14 Claims, 3 Drawing Sheets

MASTER SLICE TYPE INTEGRATED CIRCUIT

BACKGROUND OF THE INVENTION

The present invention generally relates to master slice type integrated circuits, and in particular to a master slice type integrated circuit which comprises a plurality of basic cells and a plurality of input/output cells which are pre-formed.

A master slice type integrated circuit has been widely researched and manufactured. A complementary metal oxide semiconductor (CMOS) gate array is an example of applications of the master slice type integrated circuit. The master slice type integrated circuit comprises a semiconductor chip on which there are formed basic cells arrayed like a matrix and input/output cells arranged in a peripheral region on the chip outside a region in which the basic cell matrix is formed. Generally, each basic cell comprises a plurality of transistors. Pre-processing for forming transistors except for interconnection metallizations is commonly carried out. At an interconnecting step which is a last step of steps for producing the master slice type integrated circuit, arbitrary routing of interconnection lines may be selected. Therefore, desired logic circuits can be constituted by interconnecting the basic cells and I/O cells in accordance with the user's requests.

The input/output cells (hereafter simply referred to as I/O cells) are used to supply the logic circuits on the chip with signals which are provided by an external circuit and to feed output signals of the logic circuits to the external circuit. Interconnections to build circuits of the I/O cell may be also arbitrarily made in accordance with a user's specification. Generally, the interconnection between the I/O cell circuits is made by use of a first (lower) layer metallization deposited on an insulator on a silicon crystal of the chip, and power supply lines are made by a second (upper) layer metallization.

In a practical use of the master slice type integrated circuit, a plurality of circuit blocks are constituted by coupling basic cells with one another by interconnecting lines. These circuit blocks are connected to one another by a data bus, so that signal transmission amoung the circuit blocks may be made. In this structure, an input buffer and an output buffer are interposed between each circuit block and the data bus. The input and output buffers are made up of basic cells in the matrix. Further, a latch circuit is connected to the data bus. The latch circuit has a function of preventing the data bus from being changed into a floating state, when all of the output buffers coupled with the data bus are changed into a high-impedance state. In other words, the latch circuit has a function of keeping the potential of the data bus to prevent the bus from being changed into a floating state. When the data bus is kept in the floating state, there is a risk that the circuit blocks malfunction.

Generally, the latch circuit is made up of an input inverter and an output inverter which are connected to each other in a state where the output terminal of one inverter is connected to the input terminal of the other. The input terminal of the input inverter is coupled with the data bus, and the output terminal of the output inverter is also coupled with the data bus. The input and output inverters are constituted by use of basic cells.

However, the conventional master slice type integrated circuit has the following disadvantages resulting from the latch circuit constituted by the basic cells.

Firstly, the latch circuit connected to the data bus may distort a waveform of a data signal and thereby causes a time delay of the data signal. This becomes greater as a driving capability of the latch circuit is increased. As described before, the latch circuit is made up of the basic cells. For this reason, there is a possibility that it becomes impossible to optimize the driving capability of the latch circuit with respect to the data bus. This holds true for a case that a driving capability of one basic cell is greater than a load on the data bus. In this case, it is impossible to match the driving capability of the latch circuit with the data bus, because the latch circuit having a driving capability smaller than that of the basic cell is not available. Hence, the distortion of the waveform of the data signal is increased and thereby the time delay of the data is also increased. It should be noted that the latch circuit is used to keep the potential of the data bus stable and constant. This means that it is not necessary to have a large driving capability. In particular, the driving capability of the input inverter of the latch circuit may be made smaller than that of the output inverter thereof.

Secondly, the output buffers interposed between the respective circuit blocks and the data bus must have a driving capability exceeding a load on the data bus with which a plurality of circuit elements are coupled. In this case, the presence of the latch circuit having the relatively large driving capability increases the load on the data bus. For this reason, each of the output buffers must be constituted by a number of basic cells. This also leads to the reduction of usable basic cells to build logic circuits.

SUMMARY OF THE INVENTION

Accordingly, a general object of the present invention is to provide a novel and useful master slice type integrated circuit in which the above disadvantages of the conventional master slice type integrated circuit have been effectively eliminated.

A more specific object of the present invention is to provide a master slice type integrated circuit capable of setting an optimum condition for latching the potential of a data bus.

Another object of the present invention is to provide a master slice type integrated circuit in which the distortion of a data signal is effectively suppressed and the time delay of the data signal is smaller than that in the conventional circuit.

Still another object of the present invention is to provide a master slice type integrated circuit in which an output buffer coupled between a circuit block and the data bus can be built by a smaller number of basic cells.

The above objects of the present invention can be accomplished by a master slice type integrated circuit in which various circuits may be formed by varying the routing of interconnections, comprising a plurality of input/output cells being arranged in a peripheral region on a semiconductor chip; a plurality of basic cell columns each comprising a plurality of basic cells arranged in a predetermined direction, each basic cell constituting transistors; an interconnection region formed on the chip, for accommodating a data bus; and a plurality of latch cells being arranged in the basic cell columns, for keeping a potential of a data bus laid on the interconnection region to prevent the data bus from being changed into a floating state, each latch cell comprising transistors, each of which has a driving capability smaller than that of each transistor of the basic cell.

Other objects, features and advantages of the present invention will become apparent from the following detailed description when read in conjunction with the accompanying drawings.

DETAILED DESCRIPTION

To facilitate the understanding of the present invention, a description will be given on a conventional master slice type integrated circuit with reference to FIG. 1.

Figure 1:
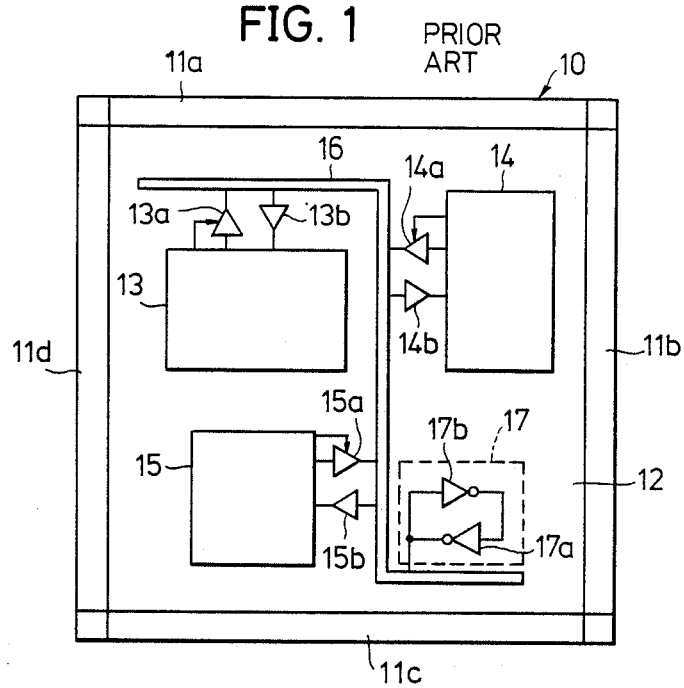
FIG. 1 is a plan view of a conventional master slice type integrated circuit.

Referring to FIG. 1, a plurality of I/O cells are arranged in a peripheral regions $11a$ to $11d$ on a surface of a semiconductor chip 10. In a central region 12 surrounded by the peripheral regions, a plurality of basic cells are arrayed like a matrix. In the central region 12, there are formed circuit blocks 13, 14 and 15 and an interconnection region for passing a data bus 16. Each of the circuit blocks 13 to 15 is made up of basic cells which are electrically coupled by interconnecting lines formed by metallizations. The circuit blocks 13 to 15 receive input data from the data bus 16 through input buffers $13b$, $14b$ and $15b$, respectively, and provide the data bus 16 with output data through output buffers $13a$, $14a$ and $15a$, respectively. The output buffers $13a$, $14a$ and $15a$ are tri-state buffers, each of which is activated with a control signal applied to a control terminal thereof.

A latch circuit 17 is connected to the data bus 16. The latch circuit 17 comprises input and output inverters $17b$ and $17a$, in which the output terminal of the inverter $17b$ is connected to the input terminal of the inverter $17a$, and the input terminal of the inverter $17b$ and the output terminal of the inverter $17a$ are connected to the data bus. The input and output inverters $17b$ and $17a$ are built by interconnecting basic cells provided in the central region 12. A set of the input and output buffers of the latch circuit is provided for each of one-bit lines constituting the data bus 16. For example, in the case where the data bus 16 is composed of 16 bits, 16 sets of the input and output buffers $17a$ and $17b$ are connected to the respective one-bit lines.

As described before, the latch circuit 17 has the function of preventing the data bus 16 from being changed into the floating state when all the output buffers $13a$, $14a$ and $15a$ are changed into the high-impedance state, that is, they are substantially disconnected from the data bus 16. In detail, the latch circuit 17 is designed to keep the potential of the data bus 16 to prevent the bus from being changed into a floating state, even when all the output buffers are changed into the high-impedance state. For this purpose, it is desirable that the driving capability of the input inverter $17b$ is relatively large, and the driving capability of the output inverter $17a$ is relatively small.

However, the conventional master slice type integrated circuit has the disadvantage discussed in the foregoing because of the structure of the latch circuit. That is, because the latch circuit 17 is constituted by use of the basic cells, there is a possibility that it is impossible to make the driving capability of the latch circuit 17 optimum with respect to the data bus 16. When the driving capability of the latch circuit 17 is unsuited for the data bus 16, the waveform of the data signal is distorted, and thereby the data signal is delayed. In addition, the output buffer $13a$, $14a$ and $15a$ must be constituted by a number of basic cells, because they must have the driving capability exceeding that of the latch circuit 17 configured by the basic cells.

Accordingly, the present invention generally intends to solve the above disadvantages of the conventional master slice type integrated circuit.

A description will be given on an embodiment of a master slice type integrated circuit provided according to the present invention with reference to FIGS. 2 through 6.

Figure 2:
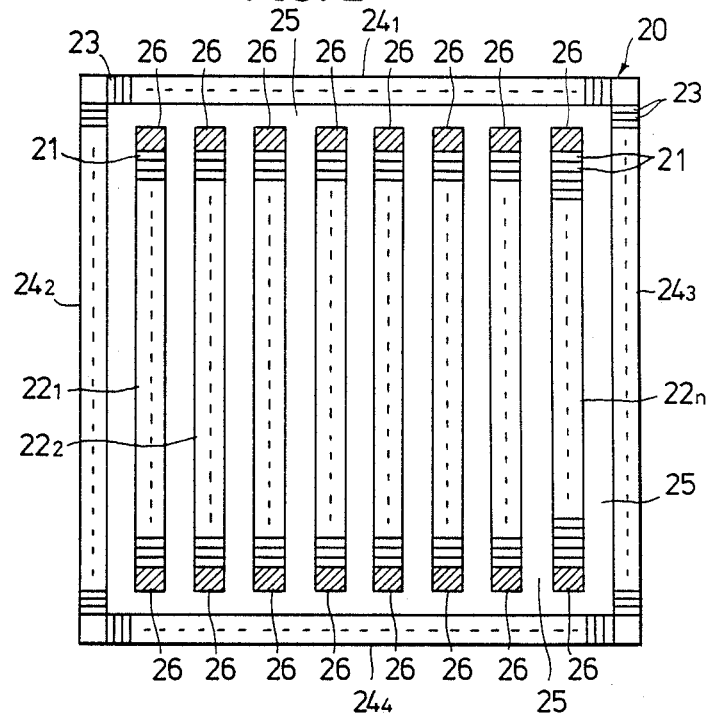
FIG. 2 is a plan view of an embodiment of a master slice type integrated circuit according to the present invention.

Referring to FIG. 2 which is a plan view of the embodiment, a plurality of columns $22_l$ to $22_n$ composed of basic cells 21 are arrayed in a central region on a surface of semiconductor chip 20. The basic cells 21 in each column are arranged in such a manner that adjacent basic cells are close to each other. The basic cell columns $22_l$ to $22_n$ are separated from each other. A plurality of columns $24_1$ to $24_4$ composed of input/output (I/O) cells 23 are arranged in a peripheral region on the semiconductor chip 20. The I/O cells 23 in each of the columns $24_1$ to $24_4$ are arranged in such a manner that adjacent I/O cells 23 are close to each other. Areas between adjacent basic cell columns $22_l$ to $22_n$ and areas between basic cell columns $22_l$ to $22_n$ and the I/O columns $24_1$ to $24_4$ are interconnection regions 25 for laying interconnecting lines such as a data bus.

Latch cell forming region 26 in which a plurality of latch cells may be formed are provided in both end portions of the basic cell columns $22_l$ to $22_n$ in the longitudinal direction thereof. The latch cells in each of the latch cell regions 26 are arranged in such a way that adjacent latch cells are close to each other.

Figure 3:
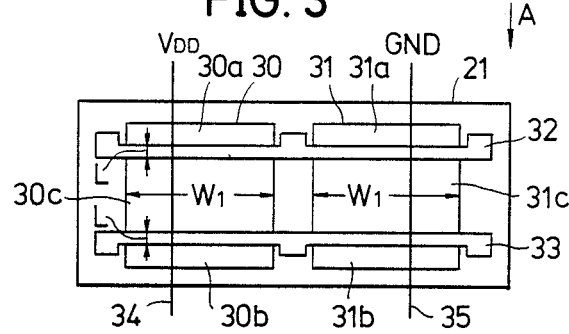
FIG. 3 is a plan view of a basic cell used in the embodiment shown in FIG. 2.

Each of the basic cells 21 has a structure shown in FIG. 3. The basic cell 21 has a p-channel metal oxide semiconductor (MOS) transistor forming region 30 and an n-channel MOS transistor forming region 31. Both the regions are separated in a direction perpendicular to a direction of an arrow A. Polysilicon gates 32 and 33 are formed over the p- and n-channel MOS transistor regions 30 and 31. The p-channel MOS transistor region 30 has source/drain regions $30a$, $30b$ and $30c$. These source/drain regions are p+-diffused regions. For example, a combination of the source/drain regions $30a$ and $30c$ and the polysilicon gate 32 constitutes a p-channel field effect transistor (frequently abbreviated as FET). Hence, the p-channel MOS transistor region 30 can provide two FETs. Likewise, the n-channel MOS transistor region 31 has source/drain regions $31a$, $31b$ and $31c$, which is n+-diffused regions. For example, a combination of the source/drain regions $31a$ and $31c$ and the polysilicon gate 32 constitutes an n-channel FET. The polysilicon gates 32 and 33 have wider portions for forming ohmic contacts at both ends and an intermediate portion thereof.

The basic cells 21 are aligned in the direction of the arrow A to constitute one of the basic cell columns $22_1$ to $22_n$. A power supply line 34 having a potential $V_{DD}$ and a power supply line 35 having a ground potential GND are laid in parallel on an insulator (not shown) coated on the basic cells 21. In the structure illustrated, the power supply lines 34 and 35 are located over the p- and n-channel MOS transistor regions 30 and 31, respectively. As seen from the above description, the integrated circuit of the embodiment has a bilayer interconnecting structure. That is, Al metallization interconnections are formed in the bilayer structure between which an insulating layer is interposed. In general, the power supply lines 34 and 35 are located at an upper layer level. A desired circuit element such as AND and OR gate, a flip-flop and the like as well as a desired circuit block can be obtained by carrying out interconnections for a basic cell or a plurality of basic cells.

Figure 4:
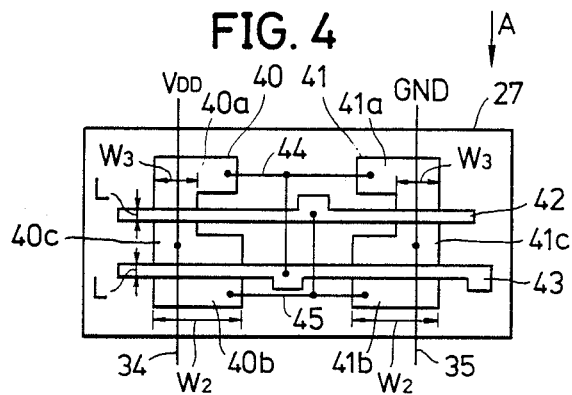
FIG. 4 is a plan view of a latch cell used in the embodiment shown in FIG. 2.

Each of the latch cells formed in the regions 26 at the both ends of the basic cell columns $22_l$ to $22_n$ has a structure shown in FIG. 4. One latch cell 27 in the latch cell region 26 comprises a p-channel MOS transistor forming region 40 and an n-channel MOS transistor forming region 41. They are separated in the direction perpendicular to the direction of the arrow A. Polysilicon gates 42 and 43 are formed over the p- and n-channel MOS transistor regions 40 and 41. The p-channel MOS transistor region 40 has source/drain regions 40a, 40b and 40c which are p+-diffused regions. For example, a combination of the source/drain regions 40a and 40c and the polysilicon gate 42 constitutes a p-channel FET. Hence, the p-channel MOS transistor region 40 can provide two FETs. Likewise, the n-channel MOS transistor region 41 has source/drain regions 41a, 41b and 41c which are n+-diffused regions. For example, a combination of the source/drain regions 41a and 41c and the polysilicon gate 42 constitutes one n-channel FET.

A length L of a channel in each of the p- and n-channel MOS transistor regions 40 and 41 formed underneath the polysilicon gate 43 is the same as a length L of each channel formed underneath the polysilicon gates 32 and 33 provided the basic cell 21 shown in FIG. 3. However, a width W2 of the channel formed underneath the polysilicon gate 43 is approximately half of a width W1 formed underneath the polysilicon gates 32 and 33 in the basic cell 21.

The polysilicon gate 42 formed over the p- and n-channel MOS transistor regions 40 and 41 forms channels each having the length L which is the same as the channel length underneath the polysilicon gates 32 and 33. However, a width W3 formed underneath the polysilicon gate 42 is approximately a quarter of the width W1 of the channels underneath the gates 32 and 33 in the basic cell 21.

The latch cells 27 are arranged in the direction of the arrow A. The power supply lines 34 and 35 extending from the basic cell arrangement are laid on the insulator coated on the p- and n-channel MOS transistor regions 40 and 41.

An interconnecting line 44 connects the source/drain regions 40a and 41a and the polysilicon gate 43 to one another. An interconnecting line 45 connects the source/drain regions 40b and 41b and the polysilicon gate 42 to one another. Further, the power supply lines 34 and 35 are connected to the source/drain regions 40a 40c through through holes. The above interconnections result in a latch circuit shown in FIG. 5.

Figure 5:
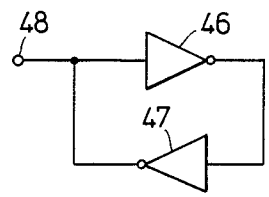
FIG. 5 is a circuit diagram of a latch circuit formed by the latch cell shown in FIG. 4.

In FIG. 5, a inverter 46 which is a part of elements forming the latch circuit in FIG. 5 is constituted by a complementary MOS (CMOS) transistor in which the polysilicon gate 43 is used as the gate electrode. As described before, the channel width W2 of the gate 43 of the inverter 46 is approximately half of the channel width W1 of the gates 32 and 33, and thus the channel area of the CMOS transistor is also approximately half of that of the basic cell 21. Therefore, the driving capability of the inverter 46 is approximately half of the driving capability of a circuit element constituted by a single basic cell 21.

An inverter 47 of the latch circuit in FIG. 5 is constituted by the CMOS transistor having a gate electrode of the polysilicon gate 42. The channel width W3 of the gate 42 of the inverter 47 is approximately a quarter of the channel width W1 of the gates 32 and 33. Therefore, the area of the channel of the CMOS transistor of the inverter 47 is approximately a quarter of that of the basic cell 21. Consequently, the driving capability of the inverter 47 is approximately a quarter of the driving capability of the circuit element constituted by a single basic cell 21.

A decrease in the width of the channel formed underneath the polysilicon gate corresponds to a decrease in the mutual conductance (gm) of a transistor and therefore a decrease in driving capability thereof. From the viewpoint of the above fact, the driving capability and the mutual conductance of the inverter 47 is smaller than the driving capability and the mutual conductance of the inverter 46. Of course, the driving capabilities and the mutual conductances of the inverters 46 and 47 are smaller than those of the inverter constituted by the basic cells.

A terminal 48 shown in FIG. 5 corresponds to a wider part located at an end of the polysilicon gate 43, and is connected to one bit of the data bus 16.

Figure 6:
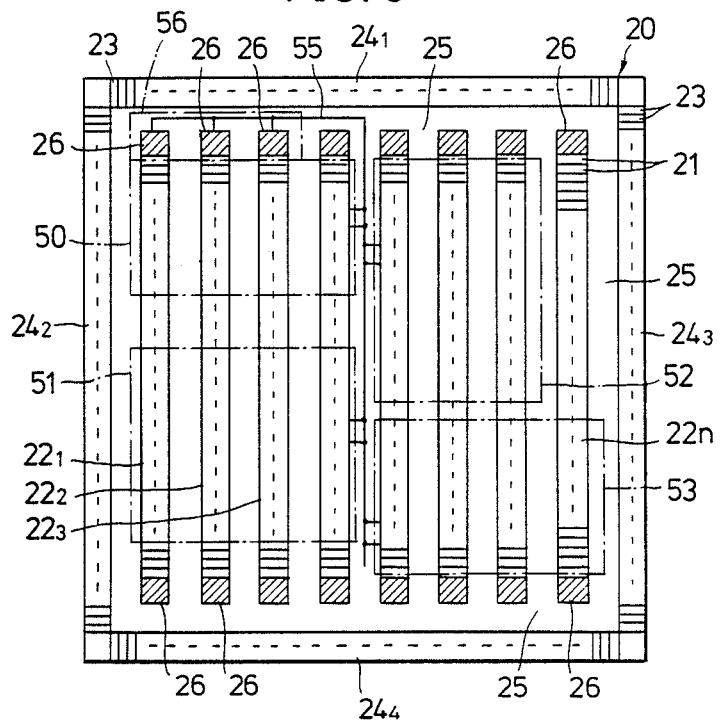
FIG. 6 is a plan view of a master slice type integrated circuit in which an interconnecting step has been carried out for the circuit shown in FIG. 2.

FIG. 6 is a plan view of a master slice type integrated circuit in which an interconnecting step has been carried out for the configuration shown in FIG. 2. Referring to FIG. 6, circuit blocks 50, 51, 52 and 53 are formed in the central region on the chip 20. The circuit blocks 50 and 51 are formed by the basic cells of four basic cell columns 22 located on the left-hand side of the figure. The circuit block 52 is formed by the basic cells of three intermediate columns 22 on the right-hand side, and the circuit block 53 is formed by the basic cells of four columns 22 on the right-hand side. A data bus 55 is provided on the interconnection channel 25. In the illustrated example, the data bus 55 has a part laid on the interconnection channel 25 interposed between the two central basic cell columns. The circuit blocks 50 to 53 are connected to the above part of the data bus 55 through the built-in input and output buffers composed of the basic cells.

The regions 26 located at upper ends of the basic cell columns $22_1$, $22_2$ and $22_3$ form a latch circuit part 56. The plurality of latch circuits each having the configuration shown in FIG. 5 are formed in each of the regions 26 in the latch circuit part 56. One latch circuit is connected to a one-bit line of the data bus 55.

As described before, the channel areas of the CMOS transistor forming the inverters 46 and 47 are approximately half and quarter that of the transistor constituted by the single basic cell 21, respectively. Therefore, an increase in the load on the data bus 55 caused by the connection of the latch circuits to the data bus 55 is small, compared with the increase in the conventional case. In addition to this advantage, it is possible to design the optimum latch circuit with respect to the data bus 55, because the driving capabilities of the inverters 46 and 47 are approximately a half and a quarter of that of the circuit element having the smallest driving capability which may be constituted by the basic cell. For this reason, the distortion of the waveform of the data signal is small and the time delay of the data signal is also small, compared to the conventional circuit. Furthermore, because the driving capability of the latch circuit is small, the output buffer through which the circuit block is connected to the data bus can be constituted by a smaller number of basic cells, In particular, the structure shown in FIG. 6 makes it possible to commonly use the power supply lines 34 and 35 for the basic cells 21 and latch cells 27, because the latch cell regions 26 are provided at both the end portions of the basic cell columns 22.

The total number of the latch cells to be formed on the chip 20 must exceed the sum of a total number of useable independent data buses and a total number of useable bits in each of the data buses. Actually, it is preferable to prepare some additional latch cells. Generally, size of the data bus is associated with the number of basic cell columns as well as the number of basic cells in each column. Therefore, the total number of latch cells to be formed may be estimated from the above. For example, when the number of basic cell columns is approximately 20 and the number of basic cells in each column is approximately 100, the number of latch cells to be formed in each of the latch cell regions 26 may be estimated as 4, which is sufficient for the practical use.

In the structure of FIG. 6, the latch cell regions 26 are provided at the both end portions of each of the basic cell columns 26. However, the present invention is not limited to this arrangement, but various arrangement of the latch cell regions may be made. For example, it is possible to arrange the latch cell regions at every other basic cell column. It is also possible to arrange the latch cell regions at either one of the end portions of the basic cell columns. Further, it is possible to arrange the latch cell regions at the intermediate parts of the basic cell columns. Although the driving capability of the inverters 46 and 47 are approximately a half and a quarter of that of the element having the minimum driving capability which may be constituted by the basic cell, the present invention is not limited to these values.

The present invention is not limited to the embodiments described above, but various variations and modifications may be made without departing from the scope of the present invention.

What is claimed is:

1. A master slice type integrated circuit in which various circuits may be formed by varying the routing of interconnections, comprising:
   a plurality of input/output cells being arranged in a peripheral region on a semiconductor chip;
   a plurality of basic cell columns each comprising a plurality of basic cells arranged in a predetermined direction, each basic cell constituting transistors;
   an interconnection region formed on the chip, for accommodating a data bus; and
   a plurality of latch cells arranged in the basic cell columns, for keeping a potential of a data bus laid on the interconnection region to prevent the data bus from being changed into a floating state, each latch cell comprising transistors, each of which has a driving capability smaller than that of each transistor of the basic cell.

2. A master slice type integrated circuit as claimed in claim 1, wherein the latch cells each comprise transistors having different driving capabilities smaller than the driving capability of the transistors of each basic cell.

3. A master slice type integrated circuit as claimed in claim 1, wherein the transistors of the basic cells and latch cells are complementary metal oxide semiconductor (CMOS) transistors.

4. A master slice type integrated circuit as claimed in claim 3, wherein channels of the CMOS transistors of each of the basic cells are wider than channels of the CMOS transistors of the latch cells.

5. A master slice type integrated circuit as claimed in claim 3, wherein the latch cells each comprise CMOS transistors having different driving capabilities smaller than the driving capability of the MOS transistors of each basic cell, and wherein channel areas of the CMOS transistors of the different driving capability of each latch circuit are different from each other in size.

6. A master slice type integrated circuit as claimed in claim 1, wherein the latch circuits each comprises first and second inverters constituted by the transistors, and which an output terminal of the first inverter and an input terminal of the second inverter are connected to a one-bit line of the data bus, and an output terminal of the first inverter is connected to an input terminal of the second inverter.

7. A master slice type integrated circuit as claimed in claim 6, wherein the driving capability of the transistors constituting the first inverter is greater than that of the transistors constituting the second inverter.

8. A master slice type integrated circuit as claimed in claim 7, wherein the driving capability of the first and second inverters are approximately a half and a quarter of a minimum driving capability of a circuit element which can be constituted by the transistors of the basic cell, respectively.

9. A master slice type integrated circuit as claimed in claim 1, wherein the plurality of the latch circuits are arranged at both end portions of each of the basic cell columns.

10. A master slice type integrated circuit as claimed in claim 1, wherein the plurality of the latch circuits amount to at least the sum of a number of independent data buses laid on the interconnection channel and a number of one-bit lines composed of each of the data buses.

11. A master slice type integrated circuit as claimed in claim 1, wherein a circuit block is built by use of the basic cells and is connected to the data bus through input and output buffers constituted by the basic cells.

12. A master slice type integrated circuit as claimed in claim 1, wherein each basic cell comprises a pair of a p-channel metal oxide semiconductor (MOS) transistor and an n-channel MOS transistor, and each of the latch cells comprises a first and second p-channel MOS transistors and a first and second n-channel MOS transistors, and wherein a mutual conductance (gm) of each of the first and second p-channel MOS transistors and the first and second n-channel MOS transistors of the latch cell is smaller than mutual conductances of the p- and n-channel MOS transistors of the basic cell.

13. A master slice type integrated circuit as claimed in claim 12, wherein the mutual conductance of the first p-channel MOS transistor of the latch cell is smaller than that of the second p-channel MOS transistor thereof, and wherein the mutual conductance of the first n-channel MOS transistor of the latch cell is smaller than that of the second n-channel MOS transistor thereof.

14. A master slice type integrated circuit as claimed in claim 13, wherein a first CMOS inverter is constituted by the second p- and n-channel MOS transistors, and a second CMOS inverter is constituted by the first p- and n-channel MOS transistors, and wherein an input of the first CMOS inverter is connected to the data bus and an output thereof is connected to an input of the second CMOS inverter, and an output of the second CMOS inverter is connected to the data bus.

* * * * *

UNITED STATES PATENT AND TRADEMARK OFFICE
CERTIFICATE OF CORRECTION

PATENT NO. : 4,837,461

DATED : June 6, 1989

INVENTOR(S) : Kubosawa et al.

It is certified that error appears in the above-identified patent and that said Letters Patent is hereby corrected as shown below:

```
Col. 2,    line  3, change "a" to --the--.
Col. 3,    line 30, delete "a" (first occurrence).
Col. 4,    line 15, change "buffer" to --buffers--;
           line 17, change "the" (first occurrence) to
                      --a--;
           line 65, change "is" to --are--.
Col. 5,    line 45, after "provided" insert --in--;
           line 68, after "40a" insert --and-- and
                      change "40c" to --41c--.
Col. 6,    line  3, change "a" (first occurrence) to --an--.
```

Signed and Sealed this

Twenty-fourth Day of July, 1990

Attest:

HARRY F. MANBECK, JR.

*Attesting Officer*    Commissioner of Patents and Trademarks